(12) United States Patent
Somekh et al.

(10) Patent No.: US 6,763,130 B1
(45) Date of Patent: Jul. 13, 2004

(54) REAL TIME DEFECT SOURCE IDENTIFICATION

(75) Inventors: Sasson Somekh, Los Altos Hills, CA (US); Amotz Maimon, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/358,512

(22) Filed: Jul. 21, 1999

(51) Int. Cl.$^7$ ................................................ G06K 9/00
(52) U.S. Cl. .................... 382/145; 382/224; 382/305; 700/110; 702/35
(58) Field of Search .................... 382/145, 149, 382/152, 160, 172, 278, 108, 199, 141, 224, 270, 318, 305; 250/559.46; 356/615, 237.1; 716/19; 702/35; 700/110, 121; 703/23

(56) References Cited

U.S. PATENT DOCUMENTS

| | | | |
|---|---|---|---|
| 4,519,041 A | * 5/1985 | Fant et al. | 382/141 |
| 4,581,762 A | * 4/1986 | Lapidus et al. | 382/263 |
| 5,539,752 A | 7/1996 | Berezin et al. | 716/19 |
| 5,649,169 A | * 7/1997 | Berezin et al. | 703/23 |
| 5,777,901 A | * 7/1998 | Berezin et al. | 716/19 |
| 5,801,965 A | * 9/1998 | Takagi et al. | 382/149 |
| 5,814,829 A | * 9/1998 | Broude et al. | 250/559.46 |
| 5,847,821 A | * 12/1998 | Tracy et al. | 356/237.1 |
| 5,910,011 A | * 6/1999 | Cruse | 438/16 |
| 5,966,459 A | * 10/1999 | Chen et al. | 382/149 |
| 5,971,586 A | * 10/1999 | Mori | 700/108 |
| 5,982,921 A | * 11/1999 | Alumot et al. | 382/145 |
| 6,049,895 A | * 4/2000 | Sugimoto | 714/46 |
| 6,185,511 B1 | * 2/2001 | Steffan et al. | 702/81 |
| 6,259,960 B1 | * 7/2001 | Inokuchi | 250/306 |
| 6,360,133 B1 | * 3/2002 | Campbell et al. | 700/115 |
| 6,373,054 B2 | * 4/2002 | Hiroi et al. | 250/310 |
| 6,404,911 B2 | * 6/2002 | Ishihara et al. | 382/149 |
| 6,408,220 B1 | * 6/2002 | Nulman | 700/33 |
| 6,427,093 B1 | * 7/2002 | Toprac | 700/121 |

FOREIGN PATENT DOCUMENTS

| | | |
|---|---|---|
| DE | 196 41 414 | 4/1997 |
| EP | 0 910 123 | 4/1999 |

OTHER PUBLICATIONS

Reinhold Ott, et al., "Yield Enhancement with Wafer Inspection Using On–the–fly Automatic Defect Classification," *Micro*, (Canon Communications, publisher; T. Cheyney, ed.), Jun. 1999, vol. 17, 6, p. 47–59.

* cited by examiner

*Primary Examiner*—Bhavesh M. Mehta
*Assistant Examiner*—Sheela Chawan
(74) *Attorney, Agent, or Firm*—McDermott, Will & Emery

(57) ABSTRACT

A method and apparatus for inspecting a semiconductor wafer provides real-time information identifying tools visited by wafers under inspection and the process parameters used at those tools, and displays this information at the wafer inspection tool. Embodiments include inspecting a wafer using an inspection tool, such as a CCD imager, generating a list of the tools visited by the wafer from data retrieved from a conventional manufacturing execution system and displaying the list at the inspection tool, along with a defect map. The user may then request that a set of process parameters and tool parameters for any of the tools identified on the list be displayed at the inspection tool. Thus, at the time that defects are discovered, the user is automatically provided with a list of the tools visited by the wafer and has easy access to the process parameters used at each of those tools. This information facilitates tracing the causes of defects to their source, such as to a particular process step or to a particular piece of processing equipment, and enables early and effective corrective action to be implemented.

33 Claims, 7 Drawing Sheets

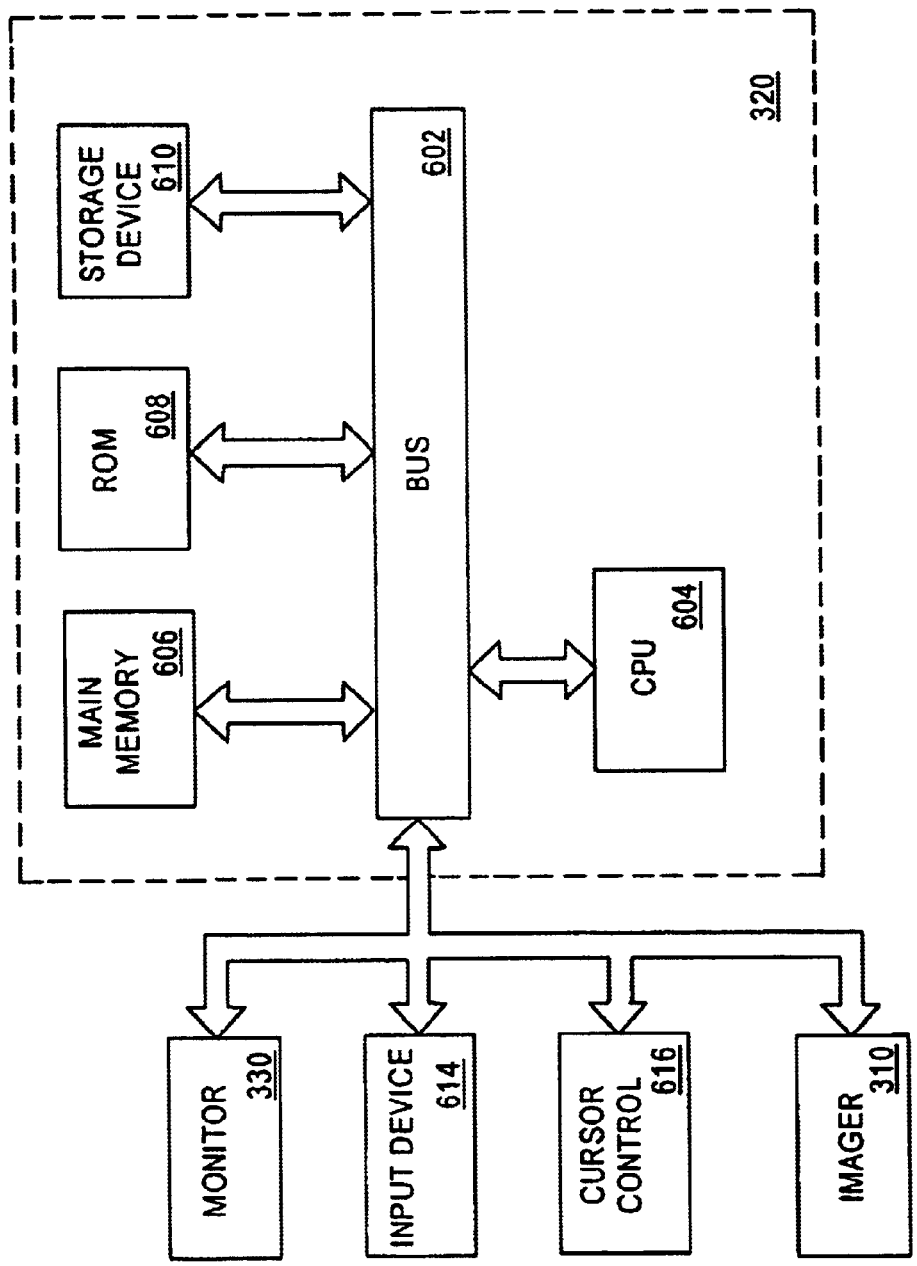

REAL TIME DEFECT SOURCE IDENTIFICATION

FIELD OF THE INVENTION

The present invention relates to a method and apparatus for identifying the causes of defects on the surface of a semiconductor substrate. The invention has particular applicability for in-line inspection of semiconductor wafers during manufacture of high-density semiconductor devices with submicron design features.

BACKGROUND ART

Current demands for high density and performance associated with ultra large scale integration call for submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

Conventional wafer fabrication process control techniques employ cassettes that each transport a plurality of wafers, each cassette typically carrying a bar code label and/or other form of identification, including wafer identification. After the completion of each process step (e.g., oxide growth, etch, clean, sputter, etc.), information related to the cassette and the "last visited tool"; i.e., the particular oven, etcher, cleaner, polishing machine, etc. used in processing the cassette, is entered into a computer software-implemented database system known as a "manufacturing execution system" (MES). Such information includes cassette identification information, parameters related to the cassette and wafers, and process parameters used at the last visited tool. Thus, the MES tracks the completed process steps, the tools at which the process steps were performed, and the wafers on which the process steps were performed.

After the completion of a series of process steps, and/or after the completion of a critical process step, such as formation of a complex photoresist mask, a number of the wafers in a cassette are inspected, typically at a stand-alone inspection tool, per instructions from the MES. At the inspection tool, the surface of the wafer to be inspected is scanned by a high-speed inspection device; for example, an opto-electric converter such as a CCD (charge-coupled device) or a laser. Typically, the inspection tool then informs the MES that it has completed its inspection. Statistical methods are thereafter employed by the inspection tool to produce a defect map showing suspected locations on the wafer having a high probability of a defect. If the number and/or density of the potential defects reach a predetermined level, an alarm is sounded, indicating that a more detailed look at the potential defect sites is warranted. A review of the potential defect sites is then conducted using the defect map, either at the inspection tool or at a separate stand-alone review station, typically by comparing images of suspected defect sites with reference images to positively determine the presence of a defect, and then analyzing the images to determine the nature of the defect (e.g., a defective pattern, a particle, or a scratch) and its cause.

In current "state of the art" wafer processing facilities, process data from the MES, and inspection and review results from the inspection tools and review stations, are periodically downloaded to another stand-alone computer softwareimplemented system called a "yield management system" (YMS), which employs statistical process control methods to monitor process quality. If the YMS determines that the process is performing outside predetermined control limits, it generates data, such as a list of tools visited by wafers exhibiting defects and the process parameters used at those tools, which are helpful in diagnosing processing problems. The user may then analyze this data to isolate the causes of the defects.

Disadvantageously, the YMS generates and reports its findings "off-line"; i.e., physically remote from the wafer processing tools and inspection tools, and remote in time from when the processing took place. Typically, communication between the MES and the YMS occurs only once or twice a day and, therefore, data from the YMS reaches the user many hours after the wafer has visited the process and inspection tools. Because the user does not receive YMS data in "real time"; i.e., at the time of wafer inspection when the user discovers that defects are occurring, the user does not have the benefit of this extremely valuable information when it is most needed; i.e., when making on-the-spot process adjustments or fault diagnoses.

There exists a need for a methodology for in-process inspection of semiconductor wafers that provides information in real time relating to the tools visited by the wafers and the process parameters used at those tools in order to identify processes causing defects, thereby enabling early corrective action to be taken. This need is becoming more critical as the density of surface features, die sizes, and number of layers in devices increase, requiring the number of defects to be drastically reduced to attain an acceptable manufacturing yield.

SUMMARY OF THE INVENTION

An advantage of the present invention is the ability to automatically retrieve information relating to the tools visited by a semiconductor wafer at a wafer inspection tool at the time of inspection of the wafer, thereby enabling efficient identification of process problem areas.

According to the present invention, the foregoing and other advantages are achieved in part by a method of inspecting a semiconductor wafer, which method comprises subjecting the wafer to a plurality of processing steps using a plurality of processing tools, each of the processing tools respectively associated with a different tool identifier and set of process parameters, and storing the tool identifiers and the set of process parameters. The wafer is then inspected for defects with an inspection tool and a list of the tool identifiers generated, using the inspection tool. The user of the present invention can then request a display of the set of process parameters associated with one of the listed tool identifiers.

Another aspect of the present invention is an apparatus for carrying out the steps of the above method.

A further aspect of the present invention is a computer-readable medium bearing instructions for inspecting a semiconductor wafer, which wafer has been subjected to a plurality of processing steps using a plurality of processing tools, each of the processing tools respectively associated with a different tool identifier, the instructions, when executed, being arranged to cause one or more processors to perform the steps of receiving the tool identifiers; inspecting the wafer for defects; and generating a list of the tool identifiers.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIG. 6 is a block diagram that illustrates an embodiment of the present invention.

DESCRIPTION OF THE INVENTION

While conventional methodologies for in-process inspection of semiconductor wafers identify defects, they do not provide information in real time relating to the tools visited by the wafer that would lead to early positive identification of the defect sources. The present invention addresses these problems by automatically providing a list of tools visited by a wafer under inspection, thereby enabling ready identification of tools and/or processes causing defects, and enabling early corrective action to be taken.

According to certain embodiments of the present invention, a semiconductor wafer is processed on a plurality of different processing tools, and a unique tool identifier is stored along with a set of process parameters for each tool, as by an MES. After processing, the wafer is inspected using an inspection tool, such as the WF7xx Series™ Wafer Inspection System available from Applied Materials of Santa Clara, Calif., and a list of the tool identifiers is generated from data retrieved from the MES, along with a defect map, and displayed at the inspection tool. The user may then request that the set of process parameters, including tool parameters (e.g., preventive maintenance conditioris), for any of the tools identified on the list be retrieved from the MES and displayed at the inspection tool. Thus, at the time that defects are discovered, the user is automatically provided with a list of the tools visited by the wafer and has easy access to the process parameters used at each of those tools. This information, along with the defect map (and other data gathered from defect review procedures, if performed), facilitates tracing the causes of defects to their source, such as to a particular process step or to a particular piece of processing equipment.

In other embodiments of the present invention, the process of tracing the causes of defects to their source is further automated. Suspected defect sites are reviewed, identified and classified, either at the inspection tool or at a stand-alone review machine. Then the classes of defects are correlated with the parameters of particular tools on the list of tools visited by the wafer. An alarm is generated if a total number of defects in a specific one of the defect classes is about equal to or greater than a predetermined number for the specific defect class, and the tool identifier associated with the specific one of the defect classes is displayed at the inspection tool, thereby pointing out a faulty tool that is a probable cause of the defects.

Figure 1:
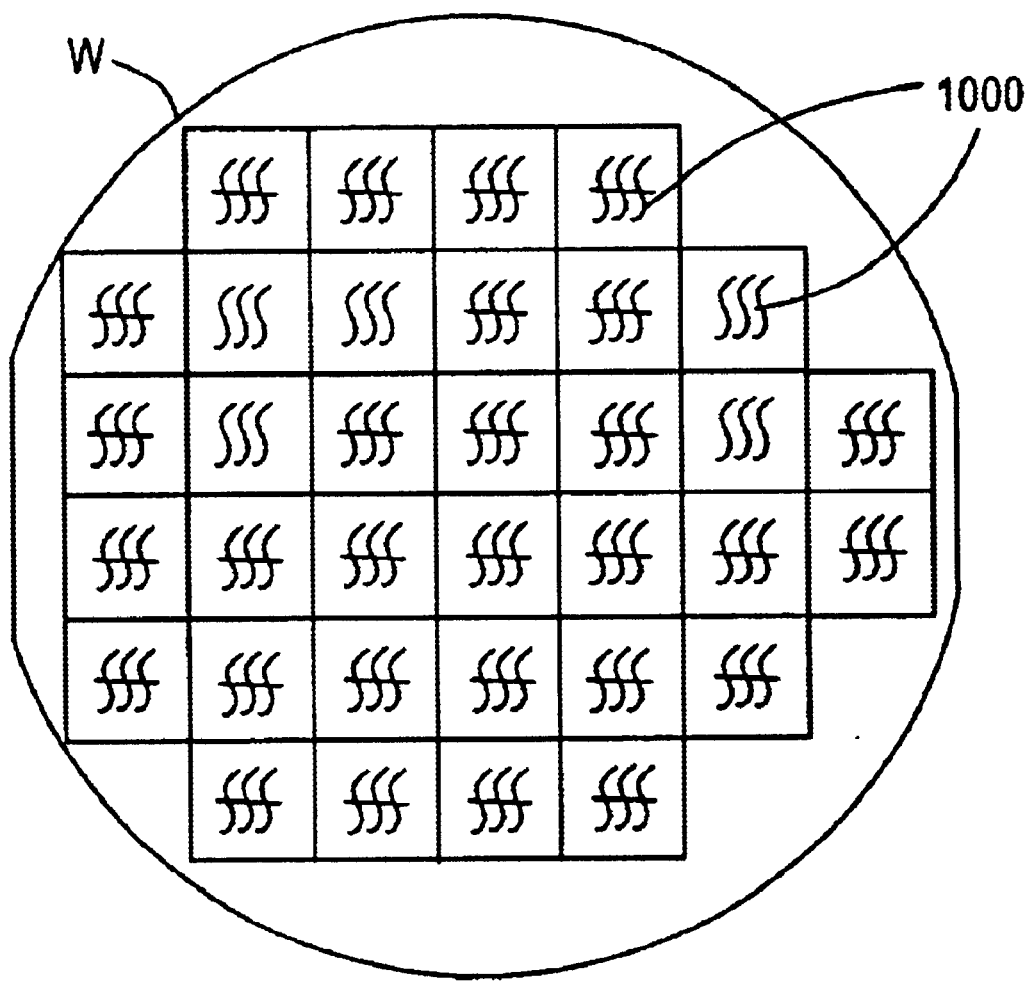
FIG. 1 illustrates a semiconductor wafer to be inspected using the present invention.
Figure 2:
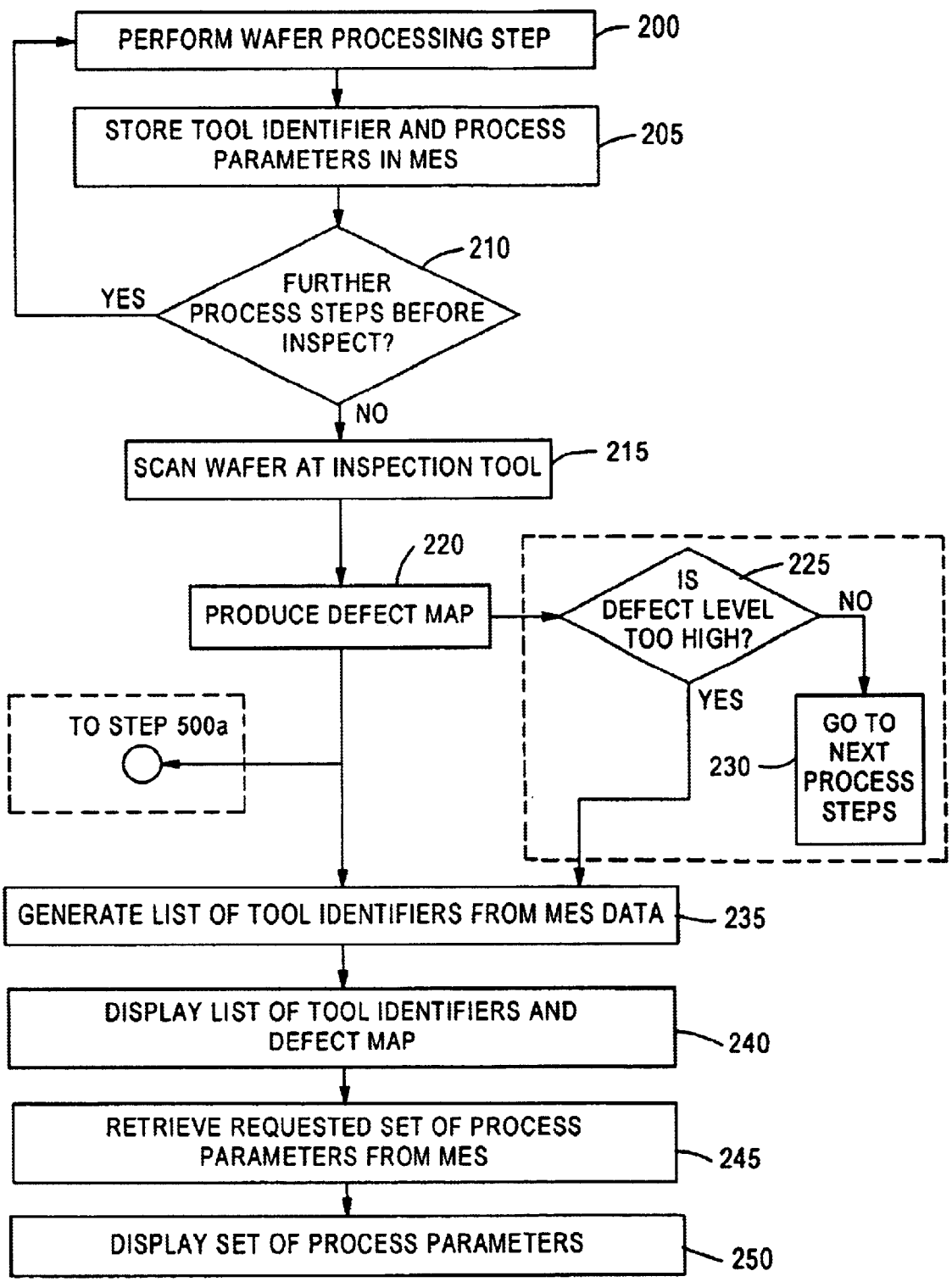
FIG. 2 is a flow chart illustrating sequential steps in a method according to an embodiment of the present invention.
Figure 3:
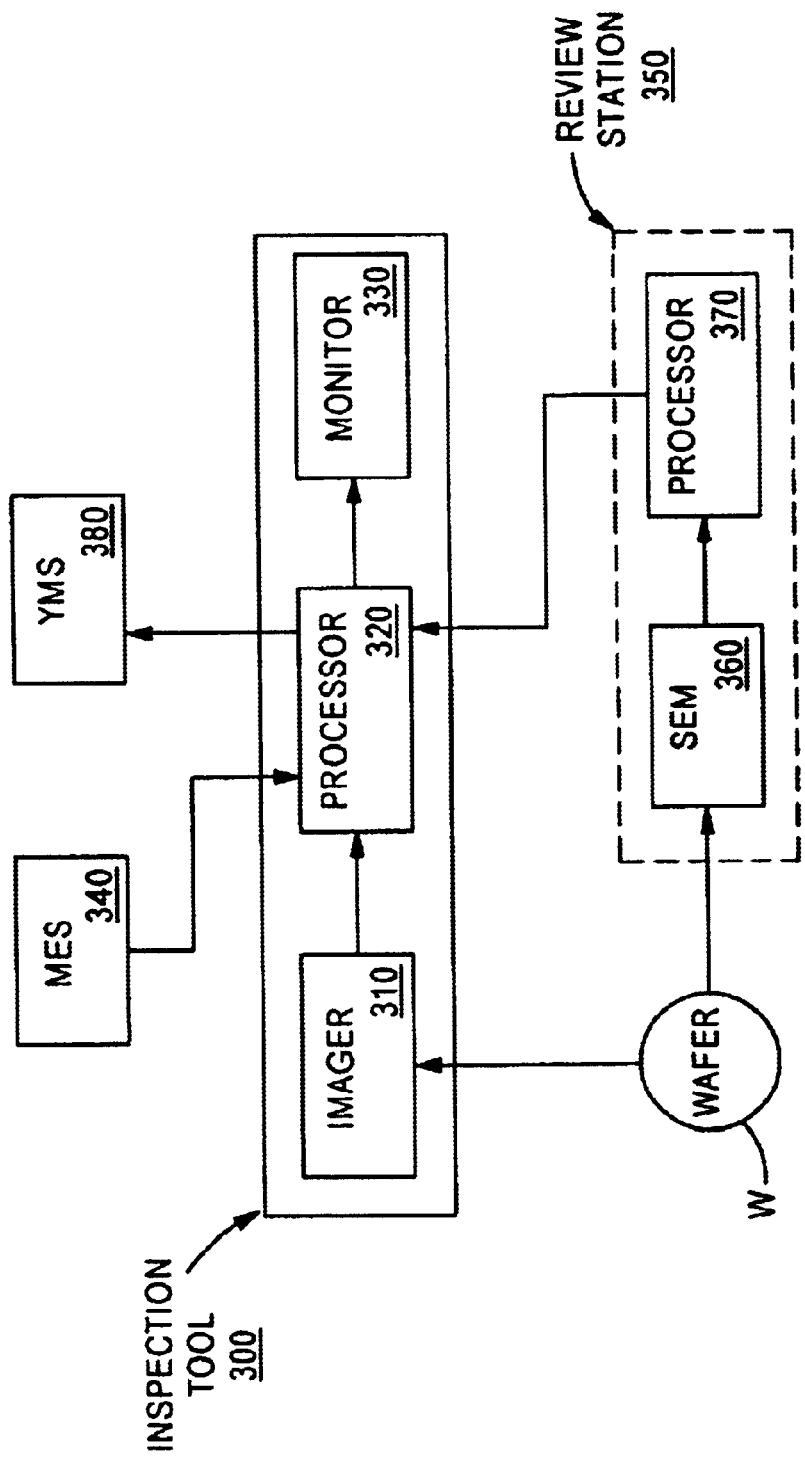
FIG. 3 schematically illustrates an apparatus used to implement the present invention.

An embodiment of the present invention is illustrated in FIGS. 1–4. The present invention is implemented at an inspection tool 300, as shown in FIG. 3, comprising an imager 310 for imaging the surface of a wafer at high speed, typically using a photo multiplier (PMT) or CCD and an illumination source such as a lamp or a laser. Inspection tool 300 further comprises a processor 320, which preferably performs the analysis disclosed herein electronically, and a monitor 330 for displaying results of the analyses of processor 320. Processor 320 is in communication with a conventional MES 340, a conventional YMS 380 and, in one embodiment of the invention described below, a review station 350.

As shown in FIG. 1, a semiconductor wafer W is processed to have a plurality of patterned integrated circuit dies 1000. Referring now to FIGS. 2 and 3, wafer W is initially subjected to a processing step at a processing tool at step 200 (FIG. 2), then a tool identifier unique to the processing tool is stored in MES 340 (FIG. 3) along with a set of process parameters used at the tool (see step 205). At step 210, it is determined (either manually by the user or automatically by MES 340) whether another processing step is to be performed on wafer W before it is to be inspected. If so, the wafer is brought to another processing tool, and steps 200, 205 and 210 are repeated.

Figure 4:
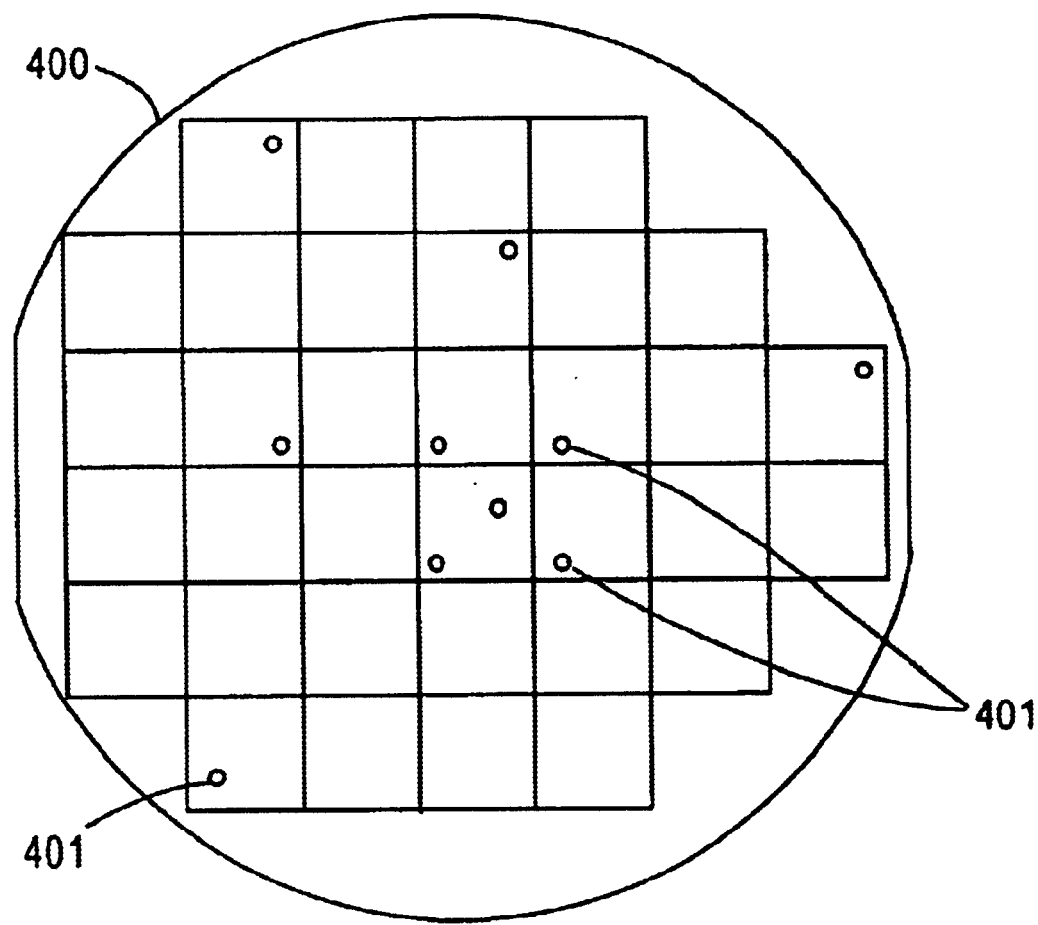
FIG. 4 illustrates a defect map produced by an inspection tool according to an embodiment of the present invention.

When no further processing steps are to be performed before inspection, wafer W is brought to inspection tool 300 and imaged by imager 310 (see step 215). A conventional defect map 400, as shown in FIG. 4, is then produced at step 220 by processor 320 using statistical methods, typically involving algorithms and/or grey-scale analysis, to identify suspected locations 401 on wafer W having a high probability of having a defect.

Next, a list of tool identifiers associated with tools visited by wafer W is generated by processor 320 retrieving the tool identifier data stored in MES 340 (see step 235) and the list is displayed at inspection tool 300 at monitor 330, along with defect map 400 (see step 240). The list of tool identifiers can be displayed on monitor 330 as a list of tool names, such as "Etcher 5" or "Cleaning Station 2". Alternatively, the list may be displayed graphically, with icons representing different tool types. The list may be generated and displayed automatically after inspection (i.e., with no intervention by the user) or only when requested by the user.

In an alternative embodiment of the present invention, at step 225, processor 320 determines a defect level for wafer W in a conventional manner, typically based on the number of suspected defect locations 401 and/or the density of suspected defect locations 401, and compares the defect level with a predetermined defect level that represents the highest acceptable defect level. If the defect level is lower than the predetermined defect level, processing of wafer W continues at step 230. However, if the defect level is about equal to or greater than the predetermined defect level, the list of tool identifiers associated with tools visited by wafer W is retrieved from MES 340, and processing continues at step 235.

Subsequently, the user can select one or more of the tools on the list of tool identifiers, such as by moving a cursor to the appropriate tool name or icon, and obtain a display of the set of process parameters, which can include tool parameters, retrieved at step 245 from MES 340 by processor 320 and displayed on monitor 330 at step 250. With this information relating to recently visited tools, the user can more readily identify a probable cause of defects at the time the defects are discovered. Additionally, this information can be fed to YMS 380 for further statistical analysis off-line.

Figure 5A:
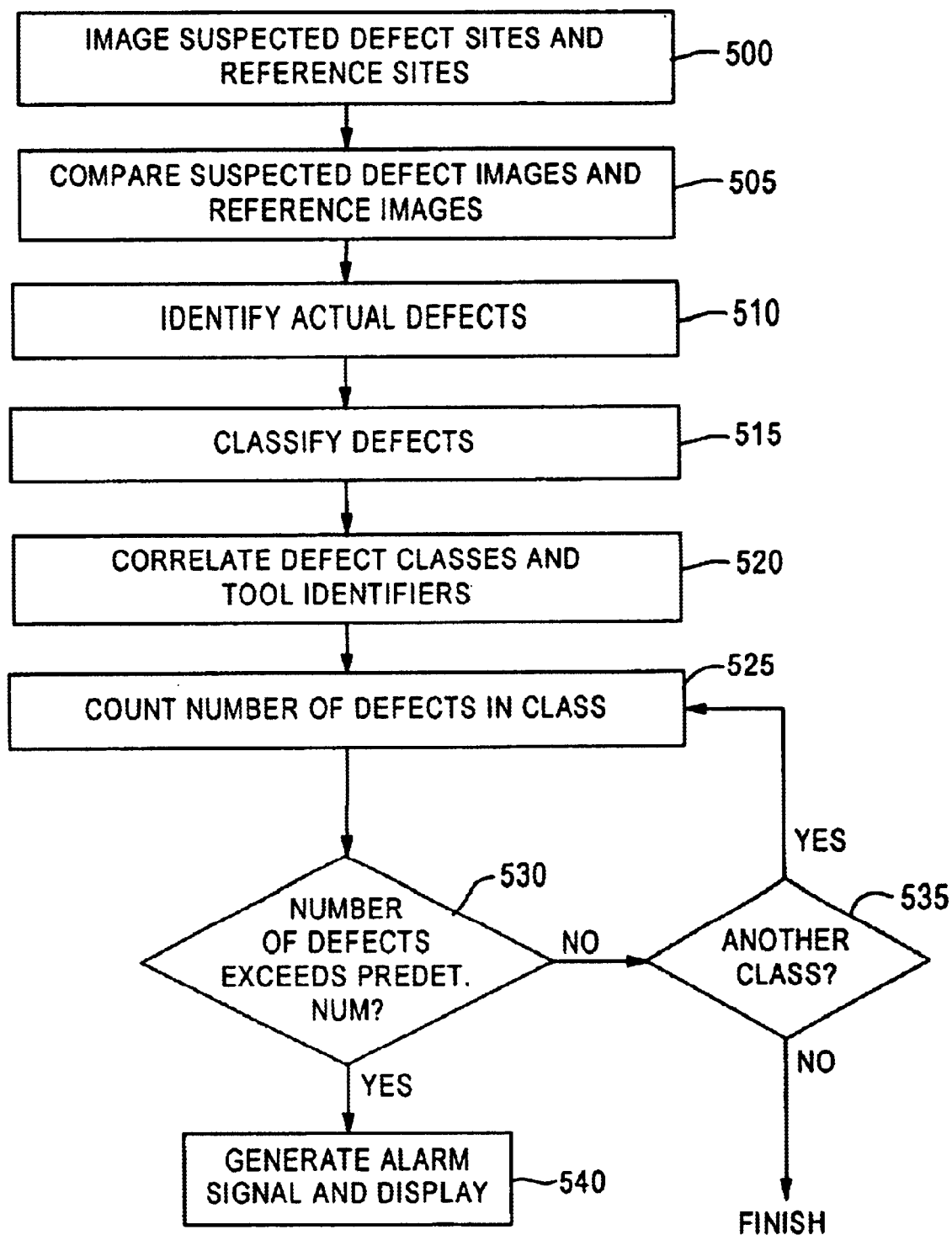
FIG. 5A is a flow chart illustrating sequential steps in a method according to another embodiment of the present invention.

In other embodiments of the invention, defects are examined and classified, and the defect classes are correlated with the tools visited by wafer W. In one technique, as shown in FIGS. 3 and 5A, suspected defect locations 401 are reviewed to identify actual defects, each of the defects is examined and classified, and the defect classes are correlated with the tools visited by wafer W. Initially, a redetection procedure is carried out; e.g., after step 240, at each suspected defect location 401 to determine the exact location of the defects. A conventional CCD imager, such as imager 310, or a conventional stand-alone SEM review station 350 (employing a processor 370 and a SEM 360, such as SEMVision™ available from Applied Materials of Santa Clara, Calif.), is used to image a pattern at a suspected defect location 401 and a reference pattern-at a corresponding location on an adjacent or other die on the same wafer which is not suspected of having a defect (see step 500). A suspected defect image is then compared to a corresponding reference pattern at step 505 by processor 320 (if the imaging is performed by imager 310) or by processor 370 (if the imaging is performed by SEM 360). If a difference is found between the suspected defective pattern and the reference pattern, the suspected defective pattern is determined to be a defect by processor 320 or processor 370 at step 510.

A more detailed review procedure is thereafter carried out on the individual defect sites, such as imaging with imager 310 or scanning with SEM 360 to produce a relatively high-resolution image, which is then analyzed at step 515 to determine the nature of the defect (e.g., a defective pattern, at particle, or a scratch) and to classify the defect accordingly. The analysis and classification of the defects can be carried out, as by one of processors 320 and 370, using conventional pattern recognition techniques or using an automated technique as described in copending U.S. patent application Ser. No. 09/111,454, filed Jul. 8, 1998, entitled "Automatic Defect Classification With Invariant Core Classes", the entire disclosure of which is hereby incorporated by reference.

Figure 5B:
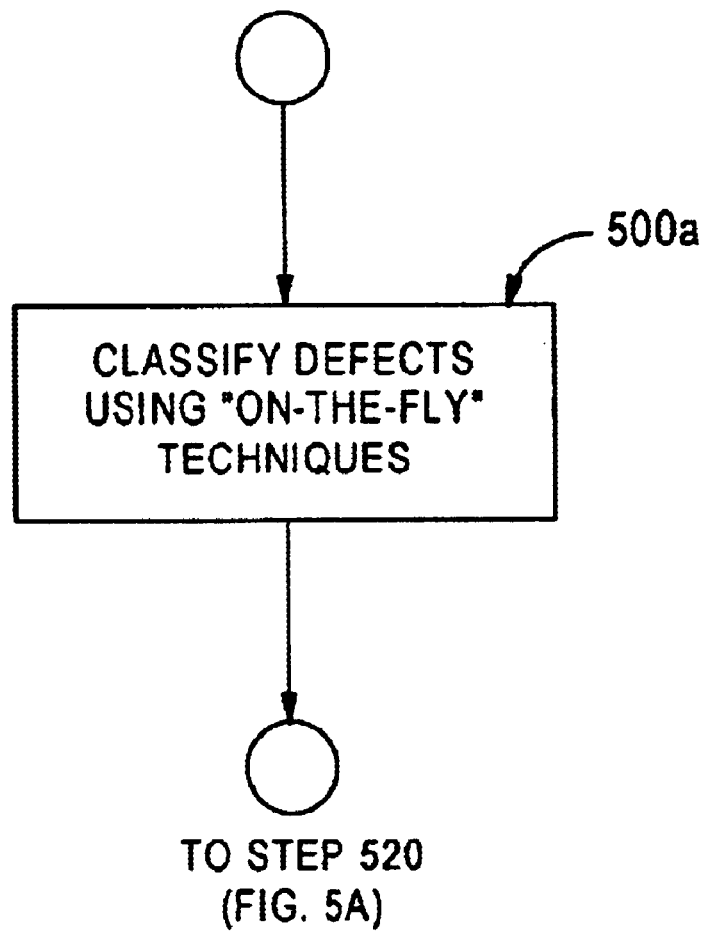
FIG. 5B is a flow chart illustrating sequential steps in a method according to still another embodiment of the present invention.

In still another embodiment of the present invention, shown in FIGS. 2 and 5B, defects are classified, at step 500a, while the wafer is being inspected and defect map 400 is being made (e.g., after step 220). This technique, known as "On-The-Fly" Automatic Defect Classification, employs a modified version of inspection tool 300; for example, the WF-736 DUO wafer inspection tool available from Applied Materials of Santo Clara, Calif., whose operation is based on the fact that different defect types have different optical scattering signatures, which signatures are registered at strategically positioned multiple detectors (e.g., photo multipliers) as they scan the wafer. On-The-Fly Automatic Defect Classification is described in an article entitled "Enhanced Yield Potential Using 'On-the-fly' Automatic Defect Classification", by Reinhold Ott and Andy Skumanich, [publication name, date and pages], the entire disclosure of which is herein incorporation by reference. Since this technique enables the acquisition of important defect information while the inspection is being performed, defect classification is carried out without a loss in production throughput.

Next, at step 520 in FIG. 5A, whether the defects have been classified "on the-fly" at step 500a or in a separate procedure at steps 500–515, the tools on the list of tool identifiers are correlated to the defect classes by processor 320, based upon the user's experiential knowledge of the causes of particular classes of defects. For example, if wafer W visited a chemical-mechanical polishing (CMP) machine, defects classified as scratches may be correlated with the particular CMP machine wafer W visited, based on the user's past observations that CMP machines commonly cause scratch defects.

Processor 320 or processor 370 preferably counts the number of defects in each class of defects (see step 525). It is determined at step 530, as by processor 320 or processor 370, whether the number of defects in one of the classes exceeds a predetermined amount reflecting the maximum allowable number of defects in that particular class, referred to as a "class alarm level". If the class alarm level is not reached, the next class is so analyzed (see step 535). If the number of defects in any one of the classes exceeds the predetermined class alarm level for that class, an alarm signal is generated, as by processor 320, and monitor 320 displays the tool identifier associated with the specific defect class, thereby indicating to the user a possibly faulty tool.

FIG. 6 is a block diagram that illustrates an embodiment of the invention shown in FIG. 3. According to this embodiment, processor 320, as shown in FIG. 3, includes a bus 602 or other communication mechanism for communicating information, and a central processing unit (CPU) 604 coupled with bus 602 for processing information. Processor 320 also includes a main memory 606, such as a random access memory (RAM) or other dynamic storage device, coupled to bus 602 for storing information and instructions to be executed by CPU 604. Main memory 606 also may be used for storing temporary variables or other intermediate information during execution of instructions to be executed by CPU 604. Processor 320 further includes a read only memory (ROM) 608 or other static storage device coupled to bus 602 for storing static information and instructions for CPU 604. A storage device 610, such as a magnetic disk or optical disk, is provided and coupled to bus 602 for storing information and instructions.

Processor 320 is coupled, as via bus 602, to monitor 330 (FIG. 3), such as a cathode ray tube (CRT), for displaying information to the user. An input device 614, including alphanumeric and other keys, is coupled to bus 602 for communicating information and command selections to CPU 604. Another type of user input device is cursor control 616, such as a mouse, a trackball, or cursor direction keys for communicating direction information and command selections to CPU 604 and for controlling cursor movement on monitor 330.

Imager 310 (FIG. 3) inputs data representative of images of a semiconductor wafer under inspection, as discussed above, to bus 602. Such data may be stored in main memory 606 and/or storage device 610, and used by CPU 604 as it executes instructions. Imager 310 may also receive instructions via bus 602 from CPU 604.

The invention is related to the use of processor 320 for inspecting the surface of a semiconductor wafer. According to an embodiment of the invention, inspection of the surface of a semiconductor wafer is provided by processor 320 in response to CPU 604 executing one or more sequences of one or more instructions contained in main memory 606. Such instructions may be read into main memory 606 from another computer-readable medium, such as storage device 610. Execution of the sequences of instructions contained in main memory 606 causes CPU 604 to perform the process steps described above. One or more processors in a multi-processing arrangement may also be employed to execute the sequences of instructions contained in main memory 606. In alternative embodiments, hard-wired circuitry may be used in place of or in combination with software instructions to implement the invention. Thus, embodiments of the invention are not limited to any specific combination of hardware circuitry and software. The programming of the apparatus is readily accomplished by one of ordinary skill in the art provided with the flow charts of FIG. 2 and FIG. 5.

The term "computer-readable medium" as used herein refers to any medium that participates in providing instructions to CPU 604 for execution. Such a medium may take many forms, including but not limited to, non-volatile media, volatile media, and transmission media. Non-volatile media include, for example, optical or magnetic disks, such as storage device 610. Volatile media include dynamic memory, such as main memory 606. Transmission media include coaxial cable, copper wire and fiber optics, including the wires that comprise bus 602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer-readable media may be involved in carrying out one or more sequences of one or more instructions to CPU 604 for execution. For example, the instructions may initially be borne on a magnetic disk of a remote computer. The remote computer can load the instructions into its dynamic memory and send the instructions over a telephone line using a modem. A modem local to processor 320 can receive the data on the telephone line and use an infrared transmitter to convert the data to an infrared signal. An infrared detector coupled to bus 602 can receive the data carried in the infrared signal and place the data on bus 602. Bus 602 carries the data to main memory 606, from which CPU 604 retrieves and executes the instructions. The instructions received by main memory 606 may optionally be stored on storage device 610 either before or after execution by CPU 604.

The inventive semiconductor wafer inspection technique provides real-time information identifying the tools visited by wafers under inspection and the process parameters including tool parameters used at those tools, thereby facilitating investigation of the causes of defects and enabling effective corrective action to be implemented at the time the defects are discovered. Thus, the present invention contributes to the maintenance of high production throughput. Furthermore, by correlating classes of defects with the tools visited by the wafers under inspection, the inventive methodology enables early identification of a faulty tool.

The present invention is applicable to the inspection of any semiconductor wafer, and is especially useful for in-process inspection of semiconductor wafers during manufacture of high density semiconductor devices with submicron design features.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of inspecting a semiconductor wafer, which method comprises:

subjecting the wafer to a plurality of processing steps using a plurality of processing tools, each of the processing tools respectively associated with a unique tool identifier for identifying the prcoessing tool;

storing the tool identifiers;

inspecting the wafer for defects with an inspection tool; and generating a list of the tool identifiers using the inspection tool.

2. The method according to claim 1, comprising displaying the list of tool identifiers at the inspection tool.

3. The method according to claim 1, comprising:

storing the tool identifiers in a manufacturing execution system (MES); and retrieving the tool identifiers from the MES to generate the list of tool identifiers.

4. The method according to claim 3, wherein each of the tool identifiers is respectively associated with a different set of process parameters, the method further comprising:

storing the sets of process parameters in the MES;

retrieving the set of process parameters associated with one of the tool identifiers after generating the list of tool identifiers; and displaying the set of process parameters associated with one of the tool identifiers at the inspection tool.

5. A method of inspecting a semiconductor wafer, which method comprises:

subjecting the wafer to a plurality of processing steps using a plurality of processing tools, each of the processing tools respectively associated with a unique tool identifier for identifying the processing tool;

storing the tool identifiers;

inspecting the wafer for possible defect sites using an inspection tool;

determining a number of possible defect sites and a density of possible defect sites on the wafer to determine a defect level for the wafer; and generating a list of the tool identifiers using the inspection tool when the defect level is about equal to or greater than a predetermined defect level, the predetermined defect level comprising a predetermined number and/or density of possible defect sites on the wafer.

6. The method according to claim 5, comprising displaying the list of tool identifiers at the inspection tool.

7. The method according to claim 1, comprising:
classifying the defects into predetermined defect classes using the inspection tool while inspecting the wafer for defects; and
correlating the defect classes to the tool identifiers.

8. The method according to claim 1, comprising:
imaging possible defect sites and reference sites on the wafer to produce possible defect images and reference images;
comparing the possible defect images and the reference images;
identifying which of the defect images represent actual defects;
classifying the actual defects into predetermined defect classes; and
correlating the defect classes to the tool identifiers.

9. The method according to claim 7, comprising:
determining a total number of defects in each of the defect classes;
determining a class alarm level for each of the defect classes;
generating an alarm signal when a total number of defects in a specific one of the defect classes is about equal to or greater than the corresponding class alarm level; and
displaying the tool identifier associated with the specific one of the defect classes.

10. The method according to claim 8, comprising:
determining a total number of defects in each of the defect classes;
determining a class alarm level for each of the defect classes;
generating an alarm signal when a total number of defects in a specific one of the defect classes is about equal to or greater than the corresponding class alarm level; and
displaying the tool identifier associated with the specific one of the defect classes.

11. An inspection tool for inspecting a semiconductor wafer that has been subjected to a plurality of processing steps in a fabrication plant, the fabrication plant comprising a plurality of processing tools, each of the processing tools respectively associated with a unique tool identifier for identifying the processing tool, the fabrication plant further comprising a storage medium that stores the tool identifiers, the inspection tool comprising:
an imager for examining the wafer for defects; and
a first processor configured to generate a list of the tool identifiers corresponding to the tools visited by the wafer.

12. The inspection tool of claim 11, further comprising a monitor for displaying the list of tool identifiers.

13. The inspection tool of claim 11, wherein the storage medium is a MES; and
wherein the first processor is further configured to retrieve the tool identifiers from the MES to generate the list of tool identifiers.

14. The inspection tool of claim 13, wherein each of the tool identifiers is respectively associated with a different set of process parameters;
wherein the MES stores the sets of process parameters; and
wherein the first processor is further configured to retrieve the set of process parameters associated with the tool identifiers.

15. The inspection tool of claim 11, wherein the imager is for inspecting the wafer for possible defect sites; and
wherein the first processor is further configured to determine a number of possible defect sites and a density of possible defect sites on the wafer to determine a defect level, and to generate the list of tool identifiers when the defect level is about equal to or greater than a predetermined defect level, the predetermined defect level comprising a predetermined number and/or density of possible defect sites on the wafer.

16. The inspection tool of claim 15, further comprising a monitor for displaying the list of tool identifiers.

17. The inspection tool of claim 11, wherein the first processor is further configured to classify the defects into predetermined defect classes when the imager examines the wafer for defects, and to correlate the defect classes with the tool identifiers.

18. The inspection tool of claim 11, wherein the fabrication plant further comprises a defect classifier having a defect review imager to produce images of possible defect sites and reference sites; a comparator to compare the possible defect images and the reference images; and a second processor configured to identify which possible defect images represent actual defects and to classify the actual defects into predetermined defect classes;
wherein the first processor is further configured to correlate the defect classes with the tool identifiers.

19. The inspection tool of claim 11, wherein the imager is for producing images of possible defect sites and reference sites;
wherein the inspection tool further comprises a comparator to compare the possible defect images and the reference images; and
wherein the first processor is further configured to identify which possible defect images represent actual defects, to classify the actual defects into predetermined defect classes and to correlate the defect classes with the tool identifiers.

20. The inspection tool of claim 17, further comprising:
a counter for counting the number of defects in each of the defect classes;
an alarm generator to generate an alarm signal when a total number of defects in a specific one of the defect classes is about equal to or greater than a predetermined class alarm level associated with the specific one of the defect classes; and
a monitor to display the tool identifier associated with the specific one of the defect classes.

21. The inspection toot of claim 18, further comprising:
a counter for counting the number of defects in each of the defect classes;
an alarm generator to generate an alarm signal when a total number of defects in a specific one of the defect classes is about equal to or greater than a predetermined class alarm level associated with the specific one of the defect classes; and
a monitor to display the tool identifier associated with the specific one of the defect classes.

22. The inspection tool of claim 19, further comprising:
a counter for counting the number of defects in each of the defect classes;
an alarm generator to generate an alarm signal when a total number of defects in a specific one of the defect classes is about equal to or greater than a predetermined class alarm level associated with the specific one of the defect classes; and a monitor to display the tool identifier associated with the specific one of the defect classes.

23. The inspection tool of claim 11, wherein the imager comprises a charge-coupled device (CCD) or a photo multiplier.

24. A computer-readable medium bearing instructions for inspecting a semiconductor wafer, which wafer has been subjected to a plurality of processing steps using a plurality of processing tools, each of the processing tools respectively associated with a unique tool identifier for identifying the processing tool, said instructions, when executed, being arranged to cause one or more processors to perform the steps of:

receiving the tool identifiers;

controlling a wafer inspection tool to inspect the wafer for defects; and generating a list of the tool identifiers.

25. The computer-readable medium according to claim 24, wherein the instructions, when executed, are arranged to cause the one or more processors to perform the step of displaying the list of tool identifiers on a monitor.

26. The computer-readable medium according to claim 24, wherein the instructions, when executed, are arranged to cause the one or more processors to perform the step of receiving the tool identifiers from an MES.

27. The computer-readable medium according to claim 26, wherein each of the tool identifiers is respectively associated with a different set of process parameters stored in the MES, and wherein the instructions, when executed, are arranged to cause the one or more processors to perform the step of receiving the process parameters associated with one of the tool identifiers from the MES after generating the list of tool identifiers.

28. A computer-readable medium bearing instructions for inspecting a semiconductor wafer, which wafer has been subjected to a plurality of processing steps using a plurality of processing tools, each of the processing tools respectively associated with a unique tool identifier for identifying the processing tool, said instructions, when executed, being arranged to cause one or more processors to perform the steps of:

receiving the tool identifiers;

controlling the wafer inspection tool to inspect the wafer for possible defect sites; determining a number of possible defect sites and a density of possible defect sites on the wafer to determine the defect level; and generating a list of the tool identifiers when the defect level is about equal to or greater than a predetermined defect level, the predetermined defect level comprising a predetermined number and/or density of possible defect sites on the wafer.

29. The computer-readable medium according to claim 24, wherein the instructions, when executed, are arranged to cause the one or more processors to perform the step of displaying the list of tool identifiers on a monitor.

30. The computer-readable medium according to claim 24, wherein the instructions, when executed, are arranged to cause the one or more processors to perform the steps of:

classifying the defects into predetermined defect classes while controlling the wafer inspection tool to inspect the wafer for defects; and correlating the defect classes to the tool identifiers.

31. The computer-readable medium according to claim 24, wherein the instructions, when executed, are arranged to cause the one or more processors to perform the steps of:

receiving images of possible defect sites and reference sites on the wafer;

comparing the possible defect images and the reference images;

identifying which of the defect images represent defects;

classifying the defects into predetermined defect classes; and correlating the defect classes to the tool identifiers.

32. The computer-readable medium according to claim 30, wherein the instructions, when executed, are arranged to cause the one or more processors to perform the steps of:

determining a total number of defects in each of the defect classes;

generating an alarm signal when a total number of defects in a specific one of the defect classes is about equal to or greater than a predetermined class alarm level for the specific one of the defect classes; and displaying the tool identifier associated with the specific one of the defect classes on a monitor.

33. The computer-readable medium according to claim 31, wherein the instructions, when executed, are arranged to cause the one or more processors to perform the steps of:

determining a total number of defects in each of the defect classes;

generating an alarm signal when a total number of defects in a specific one of the defect classes is about equal to or greater than a predetermined class alarm level for the specific one of the defect classes; and displaying the tool identifier associated with the specific one of the defect classes on a monitor.

* * * * *